United States Patent
Weng et al.

(10) Patent No.: US 12,414,232 B2
(45) Date of Patent: Sep. 9, 2025

(54) SUBSTRATE STRUCTURE

(71) Applicant: SILICONWARE PRECISION INDUSTRIES CO., LTD., Taichung (TW)

(72) Inventors: Pei-Geng Weng, Taichung (TW); Fang-Lin Tsai, Taichung (TW); Wei-Son Tsai, Taichung (TW); Yih-Jenn Jiang, Taichung (TW)

(73) Assignee: SILICONWARE PRECISION INDUSTRIES CO., LTD., Taichung (TW)

( * ) Notice: Subject to any disclaimer, the term of this patent is extended or adjusted under 35 U.S.C. 154(b) by 191 days.

(21) Appl. No.: 17/840,082

(22) Filed: Jun. 14, 2022

(65) Prior Publication Data

US 2023/0066456 A1  Mar. 2, 2023

(30) Foreign Application Priority Data

Aug. 24, 2021 (TW) .................................. 110131296

(51) Int. Cl.
*H05K 1/11* (2006.01)
*H01L 23/498* (2006.01)

(52) U.S. Cl.
CPC ........ *H05K 1/112* (2013.01); *H01L 23/49838* (2013.01); *H05K 1/113* (2013.01); *H01L 23/49822* (2013.01); *H05K 2201/09036* (2013.01); *H05K 2201/2072* (2013.01)

(58) Field of Classification Search
CPC .. H05K 1/111–115; H05K 2201/09036; H05K 2201/2072; H05K 1/112; H05K 1/113; H01L 23/49838; H01L 23/49822
See application file for complete search history.

(56) References Cited

U.S. PATENT DOCUMENTS

| | | | | |
|---|---|---|---|---|
| 5,660,321 | A * | 8/1997 | Ishida | H05K 3/3485 257/E21.511 |
| 10,861,783 | B1 * | 12/2020 | Kim | H05K 3/181 |
| 2012/0211269 | A1 * | 8/2012 | Saitou | H01L 23/49827 174/250 |
| 2016/0141236 | A1 * | 5/2016 | Kurita | H01L 23/5389 174/251 |
| 2022/0059444 | A1 * | 2/2022 | Kim | H01L 23/49822 |
| 2023/0095087 | A1 * | 3/2023 | Park | H05K 1/116 174/255 |

* cited by examiner

*Primary Examiner* — Steven T Sawyer
(74) *Attorney, Agent, or Firm* — Dority & Manning, PA

(57) ABSTRACT

A substrate structure is provided with a first electrical contact pad formed on an insulating layer of a substrate body, where the first electrical contact pad includes a first pad portion disposed on the insulating layer and at least one first protruding portion embedded in the insulating layer, so that the first pad portion is electrically connected to a circuit layer in the insulating layer by a conductive blind via, and the first protruding portion is free from being electrically connected to the circuit layer, such that, through a design of the first protruding portion, all surfaces of a metal layer formed on the insulating layer can meet the requirement of coplanarity.

8 Claims, 3 Drawing Sheets

SUBSTRATE STRUCTURE

BACKGROUND

1. Technical Field

The present disclosure relates to a semiconductor device, and more particularly, to a substrate structure.

2. Description of Related Art

In the development of semiconductor packaging, a lead frame was used as a carrier for carrying active elements at an early stage, and the main reason is that it has the advantages of lower manufacturing cost and higher reliability. However, with the vigorous development of the electronic industry, electronic products tend to be light, thin and short in type, and in function, they are in the research and development of high-performance, high-function, and high-speed. Therefore, in order to meet the requirements of high integration and miniaturization of semiconductor devices, lead frames are gradually replaced by package substrates with high-density and fine-pitch circuits in the current packaging process.

As shown in FIG. 1, a conventional package substrate 1 includes a substrate body 10, and a first electrical contact pad 11 and a metal block 12 disposed on the substrate body 10. The substrate body 10 has a plurality of insulating layers 101 and a plurality of circuit layers 100, and a second electrical contact pad 102 is formed on the outermost circuit layer 100, and each layer of the circuit layers 100 (including the second electrical contact pad 102) are electrically connected to each other by a plurality of conductive blind vias 103. The first electrical contact pad 11 is disposed on the outermost insulating layer 101 of the substrate body 10 and is electrically connected to the circuit layer 100 by the conductive blind via 103. The metal block 12 is disposed on the outermost insulating layer 101 of the substrate body 10 and is not electrically connected to the circuit layer 100 in the insulating layer 101.

In the general fan out type redistribution layer (RDL) process, the conductive blind vias 103 of each layer will have their end faces slightly concave due to the aspect ratio, so each time a layer is added, the height of the end face of the conductive blind via 103 will be lower than the surface of the insulating layer 101 where it is embedded, so that when the outermost routing is fabricated, the coplanarity of the surfaces of the outermost metal layer will be affected, that is, the topography effect occurs in the continuously stacked blind via area (such as the range of the second electrical contact pad 102) and the discontinuously stacked blind via area (such as the range of the metal block 12 and the first electrical contact pad 11), and the coplanarity will determine the chip bonding yield in the subsequent die placement process. For example, when the package substrate 1 is of the three-layer RDL specification, the specification of the coplanarity of the surfaces of the outermost metal layer (i.e., the metal block 12, the first electrical contact pad 11 and the second electrical contact pad 102) can meet the requirements. That is, the height difference between the metal block 12 (the highest surface) and the second electrical contact pad 102 (the lowest surface) is less than 2.5 micrometers (μm), so that the predetermined chip bonding yield can be maintained in the subsequent die placement process.

However, in the conventional package substrate 1, if a six-layer RDL process is employed, the coplanarity of the metal block 12, the first electrical contact pad 11 and the second electrical contact pad 102 will be too different, such that the specification of the coplanarity of the surfaces of the outermost metal layer (i.e., the metal block 12, the first electrical contact pad 11 and the second electrical contact pad 102) does not meet the requirements (for example, the height difference h between the surface of the highest metal block 12 and the surface of the lowest second electrical contact pad 102 is 4 μm, which is greater than 2.5 μm), resulting in poor chip bonding yield in the subsequent die placement process, for example, non-wetting of the solder.

Therefore, how to overcome the above-mentioned drawbacks of the prior art has become an urgent issue to be solved at present.

SUMMARY

In view of the various deficiencies of the prior art, the present disclosure provides a substrate structure, comprising: a substrate body including at least one insulating layer and a plurality of circuit layers bonded to the insulating layer, wherein the insulating layer is formed with a plurality of conductive blind vias electrically connected to the plurality of circuit layers; and at least one first electrical contact pad disposed on the insulating layer, wherein the first electrical contact pad includes a first pad portion disposed on the insulating layer and at least one first protruding portion embedded in the insulating layer, and wherein the first pad portion is electrically connected to the circuit layer by the conductive blind via, and the first protruding portion is free from being electrically connected to the circuit layer.

In the aforementioned substrate structure, the first protruding portion and the first pad portion are integrally formed, and the first protruding portion is free from contacting the circuit layer.

In the aforementioned substrate structure, the substrate body is further formed with at least one second electrical contact pad located on the insulating layer, such that the second electrical contact pad and the first electrical contact pad are located on a same surface of the insulating layer, and the second electrical contact pad is electrically connected to the circuit layer by the conductive blind via. For example, a volume of the second electrical contact pad and the conductive blind via connected thereto is equal to a volume of the first electrical contact pad and the conductive blind via connected thereto.

In the aforementioned substrate structure, an aspect ratio of the first protruding portion is smaller than an aspect ratio of the conductive blind via.

In the aforementioned substrate structure, the substrate structure further comprises a metal block formed on the insulating layer, wherein the metal block is free from being electrically connected to the circuit layer. For example, the metal block includes a second pad portion disposed on the insulating layer and at least one second protruding portion embedded in the insulating layer, and the second protruding portion is free from being electrically connected to the circuit layer. Further, the second protruding portion and the second pad portion are integrally formed, and the second protruding portion is free from contacting the circuit layer. An aspect ratio of the second protruding portion is smaller than an aspect ratio of the conductive blind via. A volume of the metal block is equal to a volume of the first electrical contact pad and the conductive blind via connected thereto.

It can be seen from the above that, in the substrate structure of the present disclosure, the first electrical contact pad includes first protruding portions embedded in the insulating layer (or the metal block includes second protruding portions embedded in the insulating layer), so that the specification of the coplanarity of the surfaces of the metal layer (i.e., the surface of the metal block, the surface of the first electrical contact pad and the surface of the second electrical contact pad) located on the same insulating layer meets the requirements, such that the predetermined chip bonding yield can be maintained in the subsequent die placement process. In other words, compared with the prior art, the substrate structure of the present disclosure can maintain the coplanarity of the surface of the outermost metal layer in the multilayer circuit structure, so as to improve the chip bonding yield in the subsequent process.

DETAILED DESCRIPTIONS

The following describes the implementation of the present disclosure with examples. Those skilled in the art can easily understand other advantages and effects of the present disclosure from the contents disclosed in this specification.

It should be understood that, the structures, ratios, sizes, and the like in the accompanying figures are used for illustrative purposes to facilitate the perusal and comprehension of the contents disclosed in the present specification by one skilled in the art, rather than to limit the conditions for practicing the present disclosure. Any modification of the structures, alteration of the ratio relationships, or adjustment of the sizes without affecting the possible effects and achievable proposes should still be deemed as falling within the scope defined by the technical contents disclosed in the present specification. Meanwhile, terms such as "upper," "first," "second," "one" and the like used herein are merely used for clear explanation rather than limiting the practicable scope of the present disclosure, and thus, alterations or adjustments of the relative relationships thereof without essentially altering the technical contents should still be considered in the practicable scope of the present disclosure.

Figure 1:
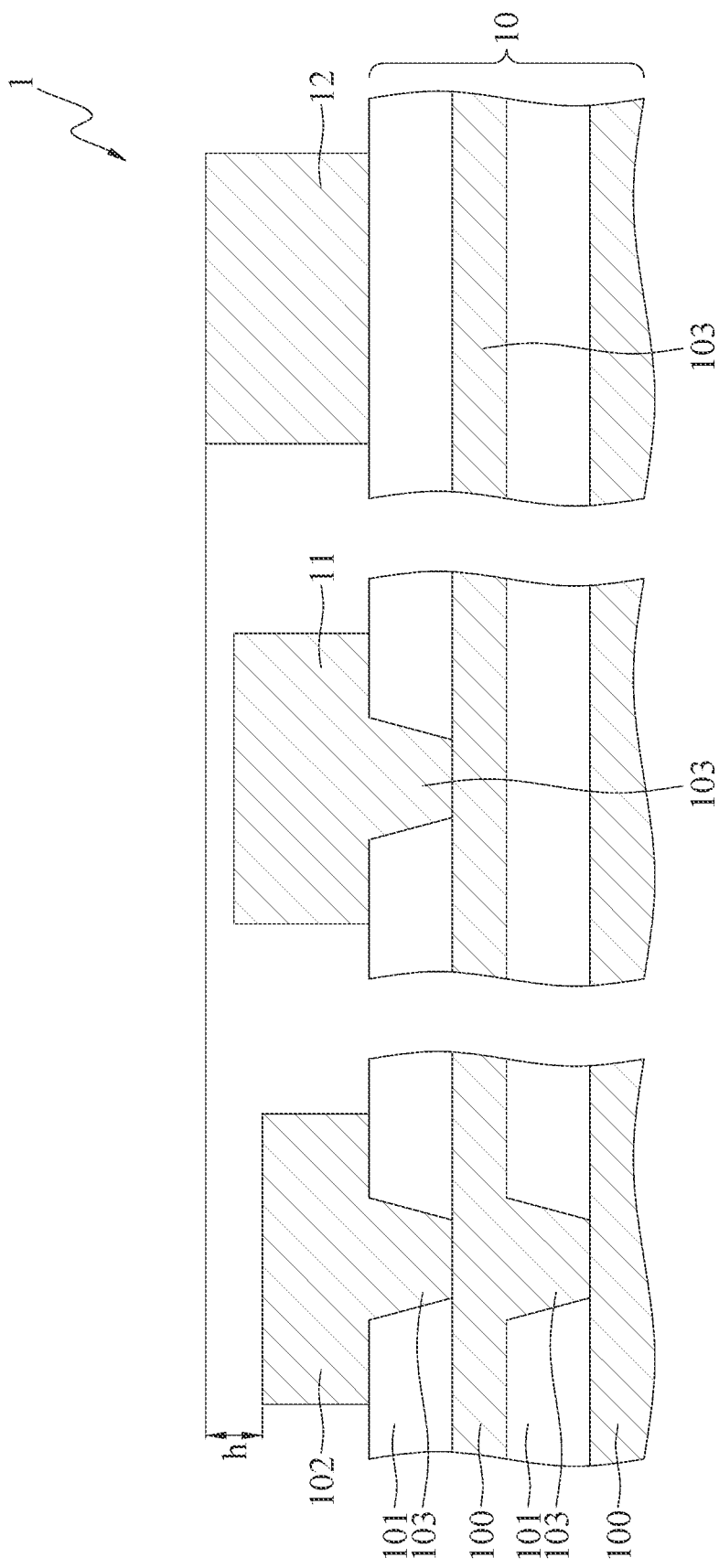
FIG. 1 is a schematic cross-sectional view of a conventional package substrate.
Figure 2:
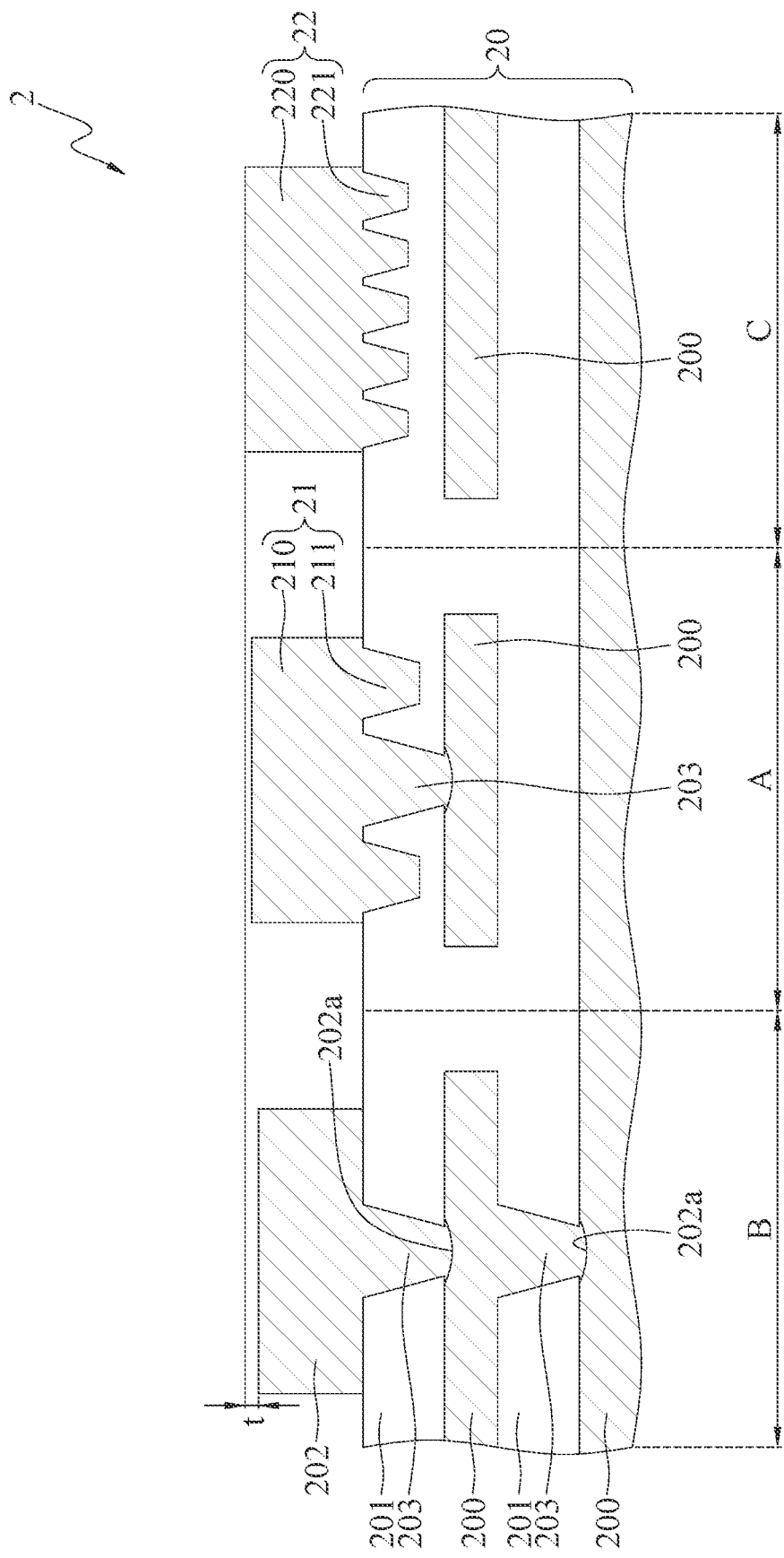
FIG. 2 is a schematic cross-sectional view of a substrate structure according to the present disclosure.

FIG. 2 is a schematic cross-sectional view of a substrate structure 2 according to the present disclosure. As shown in FIG. 2, the substrate structure 2 includes a substrate body 20, at least one first electrical contact pad 21 and at least one metal block 22 disposed on the substrate body 20.

The substrate body 20 is, for example, a package substrate with a core layer and a circuit structure or a coreless circuit structure, wherein a plurality of (at least three layers, such as six layers) circuit layers 200 (such as fan out type redistribution layers [RDL]) are formed on a plurality of insulating layers 201, and a second electrical contact pad 202 is formed on the outermost circuit layer 200, and each layer of the circuit layers 200 (including the second electrical contact pad 202) are electrically connected to each other by a plurality of conductive blind vias 203.

In an embodiment, the substrate body 20 defines a first area A, a second area B and a third area C, so that the first electrical contact pad 21 is located in the first area A, the second electrical contact pad 202 is located in the second area B, and the metal block 22 is located in the third area C.

For example, the second area B is a continuously stacked plural blind vias area, and the first area A and the third area C are discontinuously stacked plural blind vias areas. Therefore, in the second area B, a concave portion 202a is formed on the surface of the circuit layer 200 below the second electrical contact pad 202 corresponding to the conductive blind via 203.

Moreover, the material for forming each of the circuit layers 200 is copper, and each of the insulating layers 201 is a dielectric material such as polybenzoxazole (PBO), polyimide (PI), prepreg (PP) and the like, or a solder-proof material such as solder mask and graphite.

The first electrical contact pad 21 is disposed on the outermost insulating layer 201 of the substrate body 20 and is electrically connected to the circuit layer 200 by the conductive blind via 203.

In an embodiment, the first electrical contact pad 21 includes a first pad portion 210 disposed on the insulating layer 201 and at least one first protruding portion 211 embedded in the insulating layer 201, and the first protruding portion 211 is not electrically connected to the circuit layer 200. For example, the first protruding portion 211 is a pillar, which is integrally formed with the first pad portion 210, and the first protruding portion 211 does not contact the circuit layer 200 in the insulating layer 201. For instance, during fabrication, a plurality of openings are first formed on the insulating layer 201, and then the first protruding portions 211 and the conductive blind via 203 are respectively formed in the openings by electroplating and the first pad portion 210 is formed on the insulating layer 201, so as to integrally form a first electrical contact pad 21 including the first protruding portions 211 and the first pad portion 210 and a conductive blind via 203.

Furthermore, the volume of the second electrical contact pad 202 and its connected conductive blind via 203 is equal to the volume of the first pad portion 210 and its connected conductive blind via 203 and the first protruding portions 211.

In addition, the aspect ratio (e.g., the depth to width ratio) of the first protruding portion 211 is smaller than the aspect ratio of the conductive blind via 203. For example, the aspect ratio of the first protruding portion 211 is less than 1, and the aspect ratio of the conductive blind via 203 is equal to 1.

The metal block 22 is disposed on the outermost insulating layer 201 of the substrate body 20 and is not electrically connected to the circuit layer 200 in the insulating layer 201.

Figure 3C:
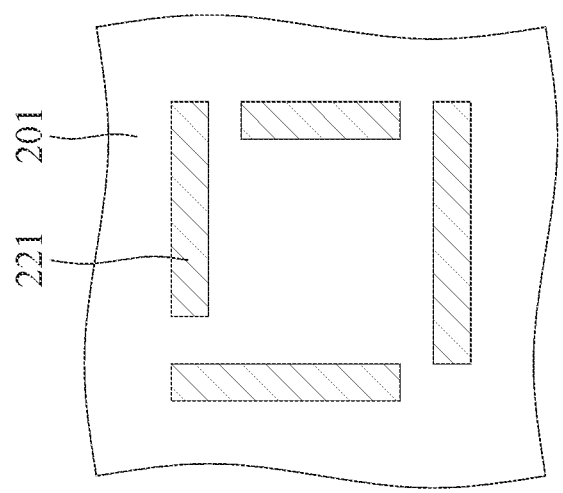
FIG. 3A to FIG. 3C are schematic top cross-sectional views of a metal block of different aspects of the substrate structure of FIG. 2.
Figure 3B:
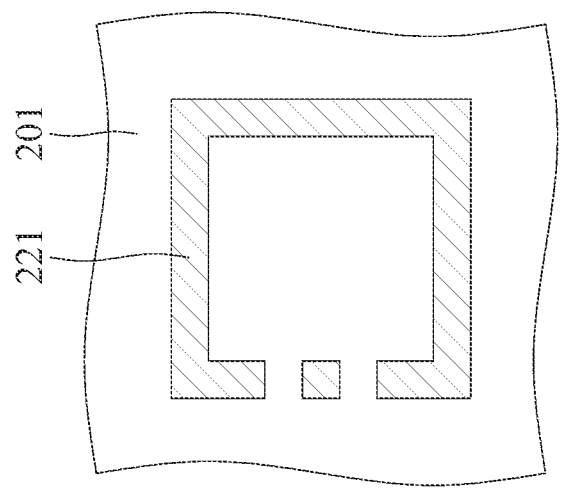
Figure 3A:
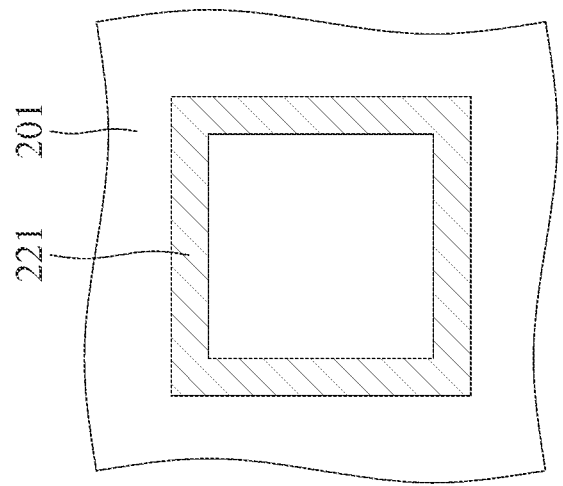

In an embodiment, the metal block 22 includes a second pad portion 220 disposed on the insulating layer 201 and at least one second protruding portion 221 embedded in the insulating layer 201, and the second protruding portion 221 is not electrically connected to the circuit layer 200. For example, the second protruding portion 221 is a pillar (as shown in FIG. 2), a ring (as shown in FIG. 3A or FIG. 3B), a wall (as shown in FIG. 3C), or other shapes, wherein the second protruding portion 221 and the second pad portion 220 are integrally formed, and the second protruding portion 221 does not contact the circuit layer 200 in the insulating layer 201. For instance, during fabrication, a plurality of openings are first formed on the insulating layer 201, and then the second protruding portions 221 are formed in the openings and the second pad portion 220 is formed on the insulating layer 201 by electroplating, so as to integrally form a second electrical contact pad 22 including the second protruding portions 221 and the second pad portion 220.

Furthermore, the surface of the metal block 22, the surface of the first electrical contact pad 21 and the surface of the second electrical contact pad 202 are approximately equal to the surface of the outermost insulating layer 201, that is coplanarity. For example, when the substrate structure 2 is a six-layer RDL specification, the surfaces of the outermost metal layer (i.e., the surface of the metal block 22, the surface of the first electrical contact pad 21 and the surface of the second electrical contact pad 202) are still coplanar, that is, the height difference t between the surface of the metal block 22 and the surface of the second electrical contact pad 202 is less than 2.5 micrometers (μm), wherein the coplanarity means that the height difference t of the surface of the outermost metal layer is less than 2.5 micrometers.

In addition, the volume of the second pad portion 220 and its connected second protruding portions 221 is equal to the volume of the first pad portion 210 and its connected conductive blind via 203 and the first protruding portions 211.

In addition, the aspect ratio of the second protruding portion 221 is smaller than the aspect ratio of the conductive blind via 203. For example, the aspect ratio of the second protruding portion 221 is less than 1, and the aspect ratio of the conductive blind via 203 is equal to 1.

Therefore, the substrate structure 2 of the present disclosure mainly employs a design of the first protruding portion 211 (or the second protruding portion 221), so that the metal block 22, the first electrical contact pad 21 (and the conductive blind via 203 connected thereto) and the second electrical contact pad 202 (and the conductive blind via 203 connected thereto) can be electroplated with the same volume on the outermost insulating layer 201, such that the specification of the coplanarity of the surfaces of the metal layer (i.e., the surface of the metal block 22, the surface of the first electrical contact pad 21 and the surface of the second electrical contact pad 202) meets the requirements. Therefore, in the subsequent die placement process, the predetermined chip bonding yield can be maintained. Thus, compared with the prior art, if the six-layer RDL process is adopted, the metal block 22, the first electrical contact pad 21 and the second electrical contact pad 202 of the present disclosure are still coplanar, so that in the subsequent die placement process, the die bonding yield can be improved, for example, the problem of non-wetting of the solder can be avoided.

It should be understood that through the design of the protruding portion, the metal surfaces of the same layer can be coplanar, so the metal block 22, the first electrical contact pad 21 and the second electrical contact pad 202 can be formed on any insulating layer 201 according to requirements, and are not limited to the outermost insulating layer 201.

To sum up, in the substrate structure of the present disclosure, the first electrical contact pad includes first protruding portions embedded in the insulating layer (or the metal block includes second protruding portions embedded in the insulating layer), so that the specification of the coplanarity of the surfaces of the metal layer (i.e., the surface of the metal block, the surface of the first electrical contact pad and the surface of the second electrical contact pad) located on the same insulating layer meets the requirements, such that the predetermined chip bonding yield can be maintained in the subsequent die placement process. In other words, the substrate structure of the present disclosure can maintain the coplanarity of the surface of the outermost metal layer in the multilayer circuit structure, so as to improve the chip bonding yield in the subsequent die placement process.

The foregoing embodiments are provided for the purpose of illustrating the principles and effects of the present disclosure, rather than limiting the present disclosure. Anyone skilled in the art can modify and alter the above embodiments without departing from the spirit and scope of the present disclosure. Therefore, the scope of protection with regard to the present disclosure should be as defined in the accompanying claims listed below.

What is claimed is:

1. A substrate structure, comprising: a substrate body including at least one insulating layer and a plurality of circuit layers bonded to the insulating layer, wherein the insulating layer is formed with a plurality of conductive blind vias electrically connected to the plurality of circuit layers; at least one first electrical contact pad disposed on the insulating layer, wherein the first electrical contact pad includes a first pad portion disposed on the insulating layer and at least one first protruding portion embedded in the insulating layer, and wherein the first pad portion is electrically connected to the circuit layer by the conductive blind via connected thereto, and the first protruding portion is free from being connected to the circuit layer; and a metal block formed on the insulating layer, wherein the metal block is free from being electrically connected to the circuit layer, wherein a volume of the metal block is equal to a volume of the first electrical contact pad and the conductive blind via connected thereto; at least one second electrical contact pad located on the insulating layer, wherein the second electrical contact pad is free from having a protruding portion, and wherein a volume of the second electrical contact pad and the conductive blind via connected thereto is equal to a volume of the first electrical contact pad and the conductive blind via connected thereto, and wherein an outermost surface of the second electrical contact pad is coplanar with an outermost surface of the first electrical contact pad.

2. The substrate structure of claim 1, wherein the first protruding portion and the first pad portion are integrally formed, and the first protruding portion is free from contacting the circuit layer.

3. The substrate structure of claim 1, further comprising at least one second electrical contact pad located on the insulating layer, wherein the second electrical contact pad and the first electrical contact pad are located on a same surface of the insulating layer, and the second electrical contact pad is electrically connected to the circuit layer by the conductive blind via connected thereto.

4. The substrate structure of claim 1, wherein an aspect ratio of the first protruding portion is smaller than an aspect ratio of the conductive blind via connected to the first electrical contact pad.

5. The substrate structure of claim 1, wherein the metal block includes a second pad portion disposed on the insulating layer and at least one second protruding portion embedded in the insulating layer, and the second protruding portion is free from being electrically connected to the circuit layer.

6. The substrate structure of claim 5, wherein the second protruding portion and the second pad portion are integrally formed, and the second protruding portion is free from contacting the circuit layer.

7. The substrate structure of claim 5, wherein an aspect ratio of the second protruding portion is smaller than an aspect ratio of the conductive blind via connected to the first electrical contact pad.

8. The substrate structure of claim 3, wherein a volume of the second electrical contact pad and the conductive blind via connected thereto is equal to a volume of the first electrical contact pad and the conductive blind via connected thereto.

* * * * *